US009306371B2

United States Patent
Morel et al.

(10) Patent No.: US 9,306,371 B2
(45) Date of Patent: Apr. 5, 2016

(54) FREQUENCY AGILE HIGH POWER MICROWAVE GENERATOR

(75) Inventors: Yannick C Morel, Falls Church, VA (US); John E McGeehan, Washington, DC (US); Clint J Novotny, Washington, DC (US); Simon Y London, Rockville, MD (US)

(73) Assignee: BAE Systems Information and Electronic Systems Intergration Inc., Nashua, NH (US)

( * ) Notice: Subject to any disclaimer, the term of this patent is extended or adjusted under 35 U.S.C. 154(b) by 998 days.

(21) Appl. No.: 13/451,870

(22) Filed: Apr. 20, 2012

(65) Prior Publication Data

US 2014/0035695 A1    Feb. 6, 2014

Related U.S. Application Data

(60) Provisional application No. 61/508,804, filed on Jul. 18, 2011.

(51) Int. Cl.
*H03K 3/00*    (2006.01)
*H03K 3/64*    (2006.01)
*H01S 4/00*    (2006.01)

(52) U.S. Cl.
CPC ... *H01S 4/00* (2013.01); *H03K 3/64* (2013.01)

(58) Field of Classification Search
CPC .................................. H03K 3/64; H01S 4/00
USPC ..................... 307/106, 108; 333/20
See application file for complete search history.

(56) References Cited

U.S. PATENT DOCUMENTS 5,153,442 A * 10/1992 Bovino ............... H03K 17/78
                                                250/214.1
5,345,321 A *  9/1994 DeJule et al. ............. 349/5
(Continued)

FOREIGN PATENT DOCUMENTS

KR      2010-0059540         6/2010

OTHER PUBLICATIONS

Zucker, Oved S. F., High-Power Microwave Generation With Photoconductors, Journal of Lightwave Technology, Aug. 1, 2008, vol. 26, No. 15, pp. 2430-2440.
(Continued)

*Primary Examiner* — Rexford Barnie
*Assistant Examiner* — Rasem Mourad
(74) *Attorney, Agent, or Firm* — Douglas P. Burum; Daniel J. Long; Scott J. Asmus

(57) ABSTRACT

A Multi-Cycle Digital High Power Microwave (MCD-HPM) source includes a microwave transmission line (MTL) to which a plurality electrically charged thin film transmission lines (TFTL's) are connected by switches. The switches are activated in sequence to generate a square wave at a microwave output frequency. The activation signal is controlled by a free space time delay, which can vary the timing and/or routing of the activation signal by modifying at least one free space element, thereby adjusting the switch activation timing and varying the output frequency. In embodiments, the switches are photo-conducting switches, the activation signal is a laser beam, and the switch timing is varied by reorienting and/or repositioning mirrors and/or other elements in the free space time delay. The elements can be manually adjusted, or mounted on motorized stages and automatically controlled. Optical amplifiers can be included to compensate for losses in the time delay elements.

20 Claims, 5 Drawing Sheets

(56) References Cited

U.S. PATENT DOCUMENTS

| | | | |
|---|---|---|---|
| 5,398,130 A | 3/1995 | Redman | |
| 5,978,125 A * | 11/1999 | Yao | 359/256 |
| 6,690,325 B1 * | 2/2004 | Zhou | B82Y 20/00 342/375 |
| 6,700,704 B2 * | 3/2004 | Estebe | G02F 1/01 250/227.12 |
| 7,268,641 B2 | 9/2007 | Zucker et al. | |
| 7,365,615 B2 | 4/2008 | Zucker et al. | |
| 7,430,347 B2 * | 9/2008 | Anderson | G02B 26/06 385/15 |
| 7,518,464 B2 | 4/2009 | London | |
| 7,692,509 B2 | 4/2010 | London | |
| 7,986,196 B2 * | 7/2011 | London | H03K 3/86 307/106 |
| 8,207,634 B2 | 6/2012 | London | |
| 2002/0101581 A1 * | 8/2002 | Murakawa et al. | 356/138 |
| 2006/0056847 A1 | 3/2006 | Akiyama et al. | |
| 2006/0279372 A1 | 12/2006 | Zucker et al. | |
| 2007/0171423 A1 * | 7/2007 | Namiki | B23K 26/0622 356/450 |
| 2009/0167453 A1 | 7/2009 | London | |
| 2010/0194208 A1 * | 8/2010 | London | H03K 3/86 307/108 |
| 2011/0091204 A1 * | 4/2011 | Doran | H04J 14/02 398/25 |

OTHER PUBLICATIONS

Zucker, O. S. F., High Power Light Activated Switching: Theory, Energy Compression Research Corp., pp. 126-129.

* cited by examiner

FREQUENCY AGILE HIGH POWER MICROWAVE GENERATOR

RELATED APPLICATIONS

This application claims the benefit of U.S. Provisional Applications No. 61/508,804, filed Jul. 18, 2011 which is herein incorporated by reference in its entirety for all purposes.

STATEMENT OF GOVERNMENT INTEREST

The invention was made with United States Government assistance under contract no. W9113M-10-C-0008 awarded by the US Army. The United States Government has certain rights in the invention.

FIELD OF THE INVENTION

The invention relates to high power microwave systems, and more particularly, to apparatus and methods for multi-cycle digital synthesis of high power microwaves.

BACKGROUND OF THE INVENTION

There has been considerable interest recently in high power microwave (HPM) sources for use in nonlethal directed energy weaponry. The ever increasing reliance on the use of microprocessors that have an increasing density of circuits packaged on a chip causes such systems to be highly vulnerable to HPM attack. Many of the HPM sources that are being developed are derivatives of sources that are well known to the vacuum electronics community. Others are unique to the HPM community, and have no analog in traditional microwave sources.

One non-traditional approach to generating HPM pulses is referred to generally as relativistic beam HPM. In this approach, high voltage capacitors, together with fast switching techniques, are used to generate a short, tailored, high voltage pulse. The pulse is then applied to an electron gun, also known as an electron beam diode. The electron beam diode produces a high-perveance electron beam, where space-charge effects dominate the interaction. The relativistic electron beam, once generated, propagates through an rf interaction region, which converts the beam's kinetic energy to HPM.

However, relativistic-beam-based HPM is limited in both maximum power (10 GW), and lifetime, due to electric field limits in the cavity and substantial cavity erosion. For these and other reasons, the relativistic-beam approach to HPM appears unlikely to provide the mega-Joule energy and terra-Watt power required for various defense missions.

A non-traditional method that avoids the limitations of relativistic-beam HPM is called multi-cycle digital HPM, or MCD-HPM. MCD-HPM is a method of digital microwave generation whereby multiple HPM sources are arrayed and triggered by a plurality of photoconductive switches that are controlled by a single coherent laser source. With reference to FIG. 1A, in one approach a Switch Bypass Source (SBS) circuit is composed of two continuous transmission line plates 100 which are connected to a load at their distant end (not shown). Between the transmission line plates 100 are quarter-wave-long plates 102 forming upper and lower thin film transmission lines (TFTL's), which are charged and are alternately connected by photoconductive switches to the upper and lower transmission line plates 100. In similar approaches, the TFTL's are alternately charged and are all connected to the same plate.

The photoconductive switches 104 are closed one-by-one, beginning with the switch furthest from the load, by sequential application of a laser beam, thereby generating a train of energy pulses of alternating polarity that propagates down the transmission line 100. The switches 104 are closed according to a timing 106 that allows previously generated pulses to pass by each switch before it is closed, which is why the term "switch bypass" is used. Each switch 104 then adds an additional energy pulse to the rear of the passing pulse train.

The timing 106 by which the laser beam is applied sequentially to the photoconductive switches 104 causes the alternating energy pulses to approximate a square wave 108 at a desired microwave frequency. With reference to FIG. 1B, the result is a high power microwave pulse with a duration determined by the number of TFTL's included in the transmission line, and with a frequency determined by the timing 106 of the switch activations. FIG. 1B is a presentation of modeling results for a digitally synthesized equal frequency microwave pulse generated using 66 TFTL's.

Typically, the timing 106 of the photoconductive switch activations is determined by the relative lengths of fiber optic connections that convey the light from the laser source to the various switches. Once the fiber optics have been selected and installed, the output frequency is essentially fixed. Any change to a different microwave output frequency would require a time-consuming, difficult, and expensive process of selecting and installing new fiber optics having different lengths.

It would be desirable to quickly and easily change the output frequency of an MCD-HPM, so that the system could be used to affect a variety of targets having different microwave frequency sensitivities. However, in the prior art there has been no known method for doing so.

What is needed, therefore, is an apparatus and method for quickly and conveniently changing the output frequency of a multi-cycle digital high-power microwave source.

SUMMARY OF THE INVENTION

A Multi-Cycle Digital High Power Microwave (MCD-HPM) source includes a microwave transmission line (MTL) to which are connected a plurality of thin film transmission lines (TFTL's). The TFTL's are connected to the microwave transmission line by switches that are activated in a desired sequence by an activation signal. The timing and sequence by which the activation signal is applied to the switches is controlled by a free space time delay, which thereby controls the output frequency of the MCD-HPM. The output frequency of the MCD-HPM is controlled and varied by repositioning at least one element in the free path of the free path delay, thereby adjusting the timing and/or the sequence of switch activations.

In various embodiments, the switches are photoconductive switches, the timing signal is a beam of light, and the free path is adjusted by a repositioning and/or reorienting mirrors and/or other optical elements. In some of these embodiments, the beam of light is generated by a laser. In certain of these embodiments, the mirrors or other elements are mounted on motorized stages and repositioned and/or reoriented under control of an activation signal controller.

In certain embodiments, optical amplifiers are included which amplify the activation signal in compensation for any losses due to mirrors and/or other components that control the free path.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

Figure 1A:
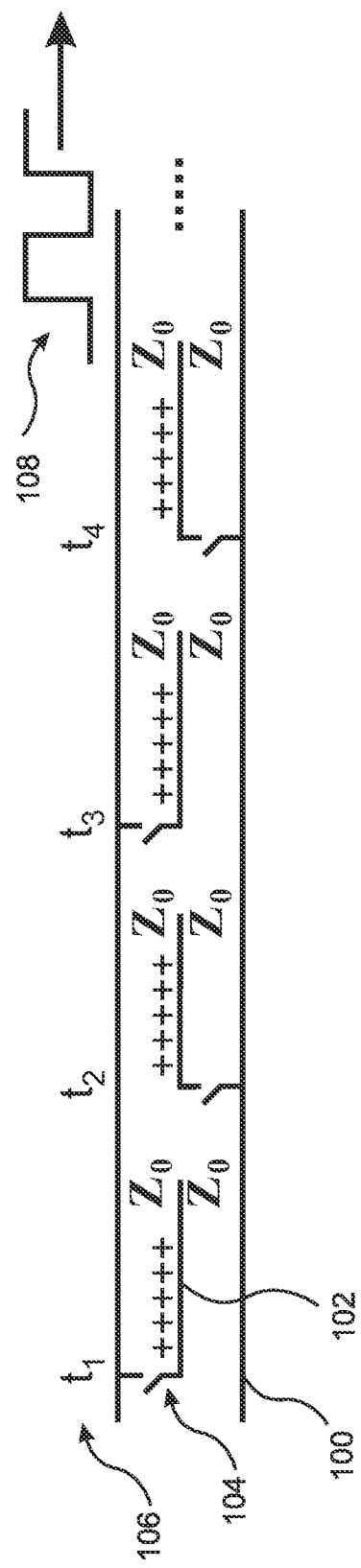
FIG. 1A is a block diagram illustrating the general configuration and operation of a plurality of electrically charged thin film transmission lines (TFTL's) coupled to a microwave transmission line by photoconductive switches.
Figure 1B:
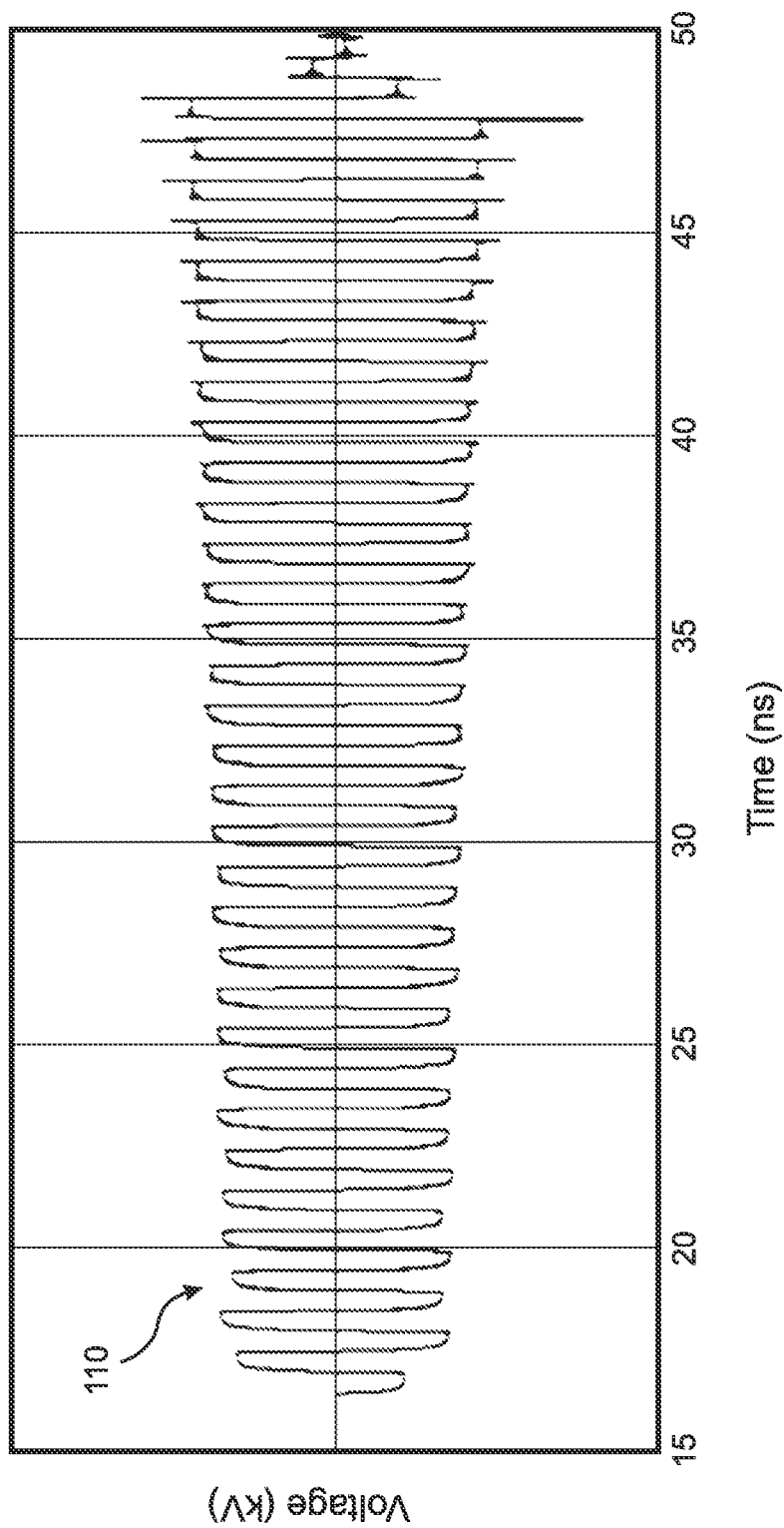
FIG. 1B is a graphical presentation of modeling results for a digitally synthesized equal frequency microwave pulse generated using 66 TFTL's.

The present invention is a Multi-Cycle Digital High Power Microwave (MCD-HPM) source that enables convenient and rapid adjustment of the microwave output frequency. The invention is applicable to an MCD-HPM apparatus having a configuration similar to the prior art configuration shown in FIG. 1, which includes a microwave transmission line (MTL) 100 to which a plurality of thin film transmission lines (TFTL's) 102 are connected by a plurality of switches 104. The switches 104 are closed by an activating signal in a sequence and with a timing that causes a train of energy pulses of alternating polarity to propagate down the transmission line 100. The timing 106 and sequence by which the activating signal is applied to the switches 104 causes the alternating energy pulses to approximate a square wave 108 at a desired microwave frequency.

For conventional MCD-HPM devices the output frequency is essentially fixed by the lengths of the fiber optics used to deliver the activating signal to the switches. In contrast, the output frequency of the present invention includes a novel apparatus and method that control and adjust the timing and/or sequence of the activating signal, which controls the timing and/or sequence in which the switches 104 are activated and the energy pulses are generated, thereby controlling and adjusting the microwave output frequency. Specifically, the activation signal is controlled by a free space time delay, and the output frequency of the MCD-HPM is controlled by repositioning and/or reorienting at least one element in the free path of the free path delay, thereby adjusting the timing of the activation signal and/or the activation sequence of the switches.

Figure 2:
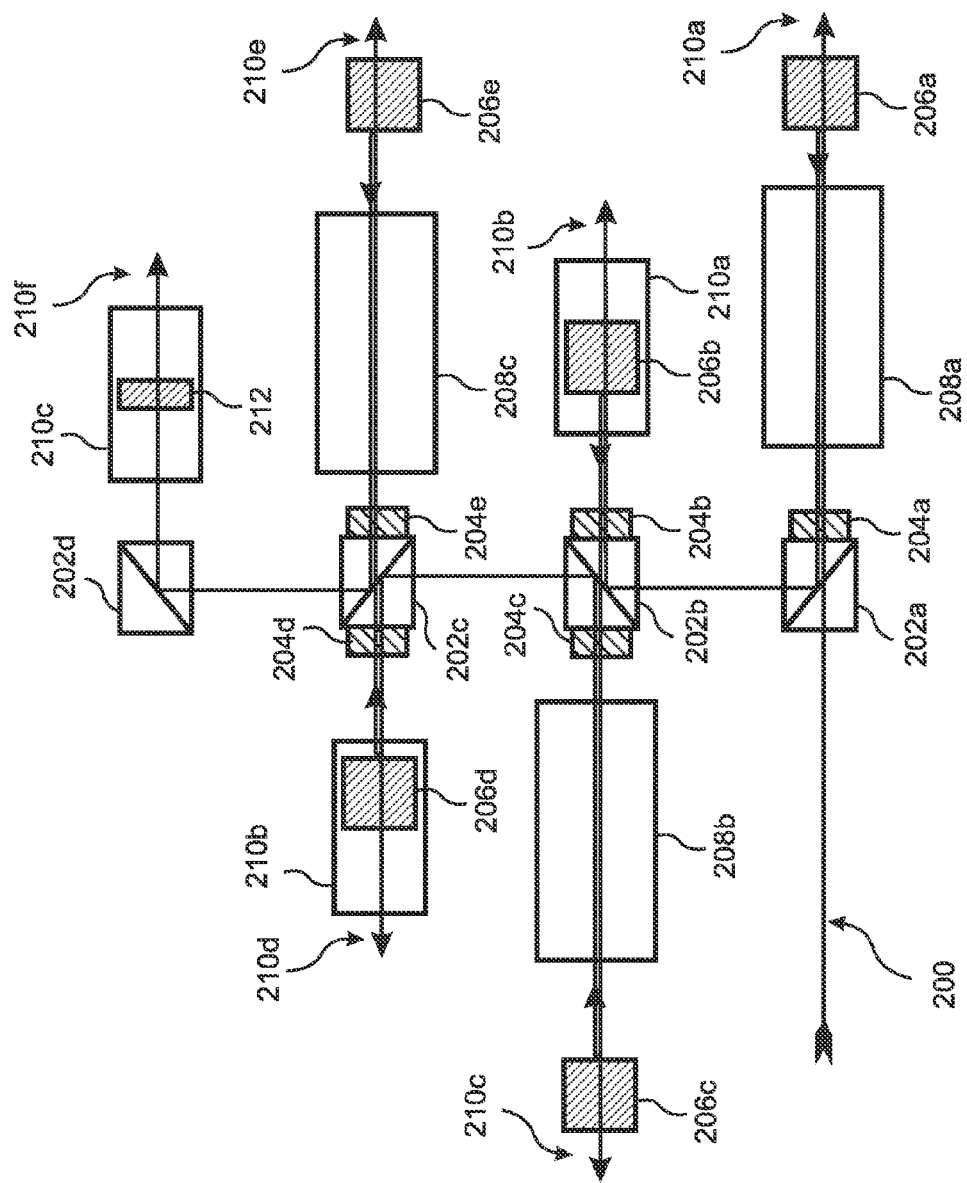
FIG. 2 is a block diagram of a free space time delay with repositionable mirrors that vary the output timing of the activation signal in an embodiment of the present invention.

With reference to FIG. 2, in embodiments the switches 104 are photoconductive switches and the activation signal is a light beam 200, which in some embodiments is a laser beam. In the embodiment of FIG. 2, the free path of a laser beam 200 is controlled by a plurality of polarizing beam splitters 202, quarter-wave plates 204, and partially transmitting mirrors 206. The beam splitters 202 are configured to reflect or transmit light according to its linear polarity. Light that is linearly polarized along a transmission axis will be transmitted, while light that is linearly polarized perpendicular to the transmission axis will be reflected. The quarter-wave plates 204 are configured to rotate the polarization of the laser beam by 45 degrees each time it passes through the quarter-wave plate. The partially transmitting mirrors 206 are configured to transmit a fraction of impinging light while reflecting the remainder. In embodiments, the partially transmitting mirrors 206 transmit approximately 80% of the impinging light and reflect the other 20%.

In the embodiment of FIG. 2, laser light 200 enters the free space apparatus polarized along the transmission axis of the first beam splitter 202a, so that it passes though the beam splitter 202a essentially without reflection. After passing through the splitter 202a, the polarization of the beam is rotated 45 degrees by the first quarter-wave plate 204a and then amplified by an optical amplifier 208a, after which it strikes the first mirror 206a. Some of the light 210a passes through the mirror 206a and enters a fiber-optic (not shown) which delivers it to a first photoconductive switch. The remainder of the light is reflected from the mirror 206a, is amplified a second time by the first optical amplifier 208a and passes a second time through the first quarter-wave plate 204a. This second passage through the first quarter-wave plate 204a rotates the light by an additional 45 degrees, so that it has been rotated a total of 90 degrees relative to its initial polarization and is therefore reflected by the beam-splitter 202a. Note that the optical amplifier 208a compensates for the loss of light transmitted through the mirror 206a, and for any losses in the other components.

The light then strikes the second beam splitter 202b, which is oriented so as to reflect the beam to a second partially transmitting mirror 206b. Once again, some of the light passes through the mirror 206b and enters a fiber optic which delivers it to a second photoconductive switch. The remaining light is reflected back to the mirror 202b. A double-passage through a second quarter-wave plate 204b rotates the polarization of the light by 90 degrees, so that it passes through the beam splitter 202b, through another quarter-wave plate 204c, and through a second optical amplifier 208b. Some of the light passes through a third mirror 206c, and into a fiber optic that delivers it to a third photoconductive switch, while the remaining light is reflected back through the second optical amplifier 208b and the quarter-wave plate 204c. The double-passage through the quarter-wave plate 204c reorients the polarization of the light so that it is reflected by the beam splitter 202b and directed to the third beam splitter 202c.

The transit of the laser beam continues through the system according to the pattern described above, providing light to a series of fiber optic outputs and thence to series of photoconductive switches. In the final stage, the quarter-wave plate is omitted, and the partially transmitting mirror is replaced by a simpler unit 212 that includes only a fiber optic port, and in some embodiments also an optical attenuator. Assuming that all of the fiber optics are equal in length, the timing by which the switches are activated is determined by the optical path lengths between the mirrors. Note that, for clarity of illustration, the reflected laser beam paths are shown in FIG. 2 as being slightly offset from each other. In actuality, the reflected beam paths typically overlap, and if accurately depicted would appear as single overlapping lines.

Control and adjustment of the optical path lengths, and thereby control of the activation timing, is realized in FIG. 2 by physical movement of some of elements in the path. Specifically, two of the partially transmitting mirrors 206b, 206d and the final exit port 212 are mounted on motorized stages and are automatically repositioned as needed by an activation signal controller (not shown). It can be seen that, in general, every other mirror 206 (or exit port 212) in the optical path is mounted on a motorized stage. Movement of a mirror 206 (or exit port 212) causes a corresponding change in distance between that mirror 206 (or exit port 212) and both the preceding and subsequent mirror. As a result, the timing between switch activations is increased or decreased.

Note that in the embodiment of FIG. 2 the output of each translatable mirror 206 or exit port 212 is physically connected to an end of a fiber optic that travels with the mirror or port. Therefore, movement of a mirror 206 or output port 212 does not change the time required for the light to travel from the mirror or output port to the photoconductive switch.

Although only six outputs are illustrated in FIG. 2, it should be clear that an almost arbitrary number of outputs can be provided by simply repeating the pattern of components illustrated in the figure as many times as is desired.

Figure 3A:
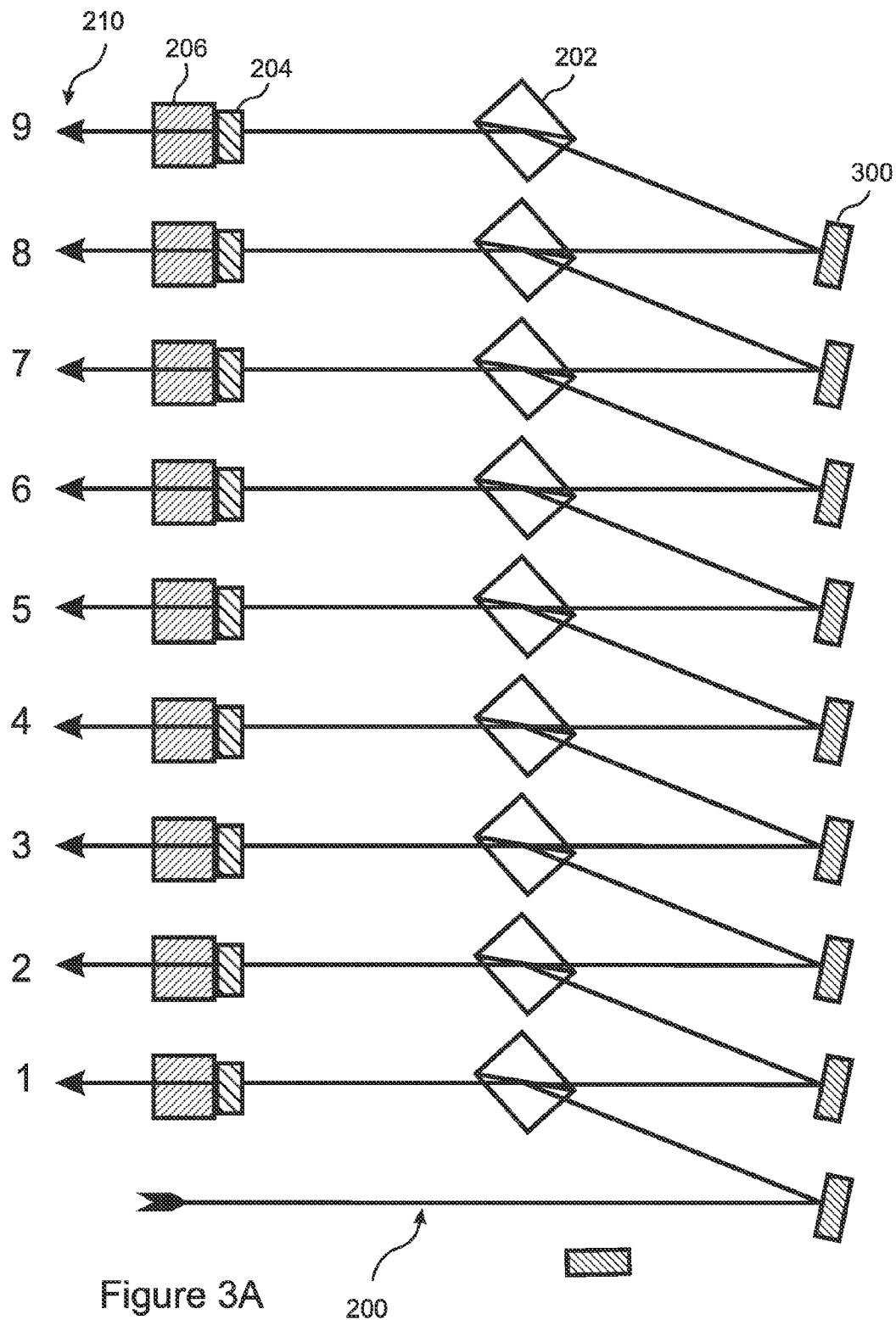
FIG. 3A is a simplified block diagram of a free space time delay with rotatable mirrors that vary the output sequence of the activation signal in an embodiment of the present invention.
Figure 3B:
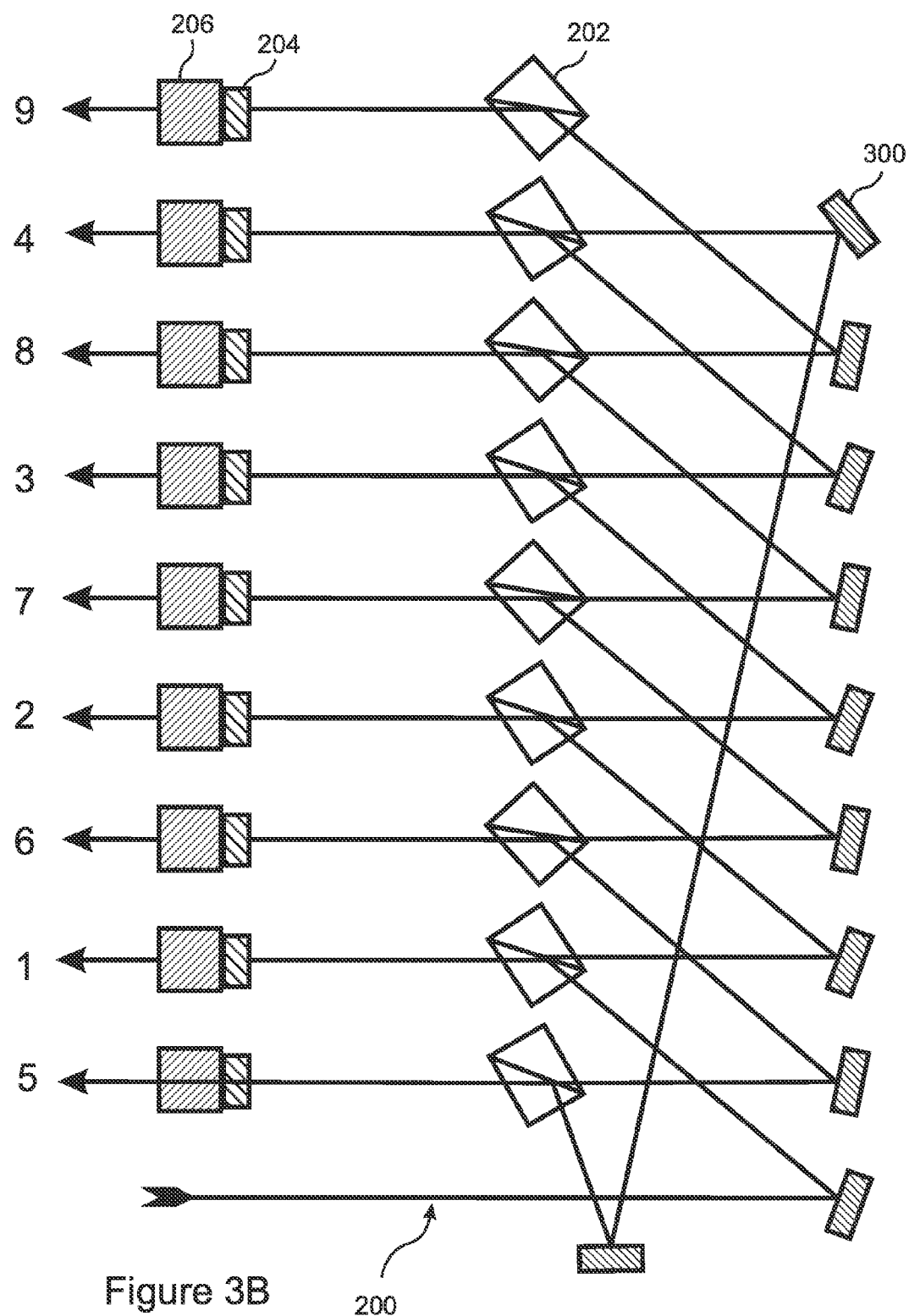
FIG. 3B illustrates the embodiment of FIG. 3A showing the mirrors in different orientations and the outputs activated in a different sequence.

While the embodiment of FIG. 2 is limited to automatic repositioning of mirrors, other embodiments include manual and/or automatic movement of other components, as well as manual and/or automatic reorientation of components. FIG. 3A is a simplified diagram illustrating an arrangement of partially reflecting mirrors 206, quarter-wave plates 204, beam splitters 202, and fully reflecting mirrors 300 configured to provide light sequentially to a series of outputs 210, and from thence to a series of photoconductive switches. In the embodiment of FIG. 3A, the fully reflective mirrors 300 and the beam splitters 202 are mounted on rotating stages that are controlled by an orientation controller (not shown). By reorienting the fully reflective mirrors 300 and the beam splitters 202 as shown in FIG. 3B, the laser light can be delivered to every other output sequentially, thereby changing the sequence in which the switches are activated. Note that FIGS. 3A and 3B present a simplified example for the sake of illustrating a principle. In actual embodiments, both the orientations and locations of components are controlled, so as to adjust both the sequence and the timing of the switch activations. In some embodiments, the components are not arranged in a linear fashion, as shown, but are arranged in a circle, or in some other configuration.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. An apparatus for generating frequency-variable multi cycle digital high power microwaves (MCD-HPM), the apparatus comprising:
   a microwave transmission line (MTL);
   a plurality of thin film transmission lines (TFTL's), each TFTL being configured to store an electric charge, each TFTL being connected to the MTL by a corresponding switch, the switch being configured to discharge the corresponding TFTL and thereby introduce an energy pulse into the MTL when the switch is activated;
   an activation signal controller configured to apply activation signals sequentially to the switches from a plurality of outputs, each activation signal being applied to activate a single corresponding switch, the activation signal controller including a free space time delay that controls an activation timing with which the activation signals are applied to the switches, the activation timing being configured to introduce a train of energy pulses into the MTL, wherein the train of energy pulses approximates a square wave at an output microwave frequency; and
   a plurality of variable elements included in the activation signal controller, the variable elements being independently variable in at least one of position and orientation so as to modify the free space time delay, thereby modifying the activation timing, and thereby adjusting the output microwave frequency.

2. The apparatus of claim 1, wherein the energy pulses are of alternating polarity.

3. The apparatus of claim 1, wherein at least one of the variable elements is independently variable in orientation, and the free space time delay can be modified by reorienting at least one of the variable elements.

4. The apparatus of claim 1, wherein the free space time delay can be modified by repositioning at least one of the variable elements.

5. The apparatus of claim 1, wherein the switches are photoconductive switches, and the activation signal is a beam of light.

6. The apparatus of claim 5, wherein the beam of light is a laser beam.

7. The apparatus of claim 5, wherein for each of the switches the activation signal controller includes a corresponding partially reflecting mirror configured to deliver to the switch a transmitted portion of light incident on the partially reflecting mirror.

8. The apparatus of claim 7, wherein the plurality of variable elements includes at least one variable mirror that is one of the partially reflecting mirrors, said variable mirror being affixed to a motorized stage that is configured to vary said variable mirror by at least one of repositioning and reorienting the variable mirror.

9. The apparatus of claim 8, wherein an optical output of the variable mirror is cooperative with an input of a fiber optic cable configured to deliver to the corresponding switch the transmitted portion of light, the input of the fiber optic cable being maintained in constant relationship with the output of the variable mirror so that a transit time of the transmitted portion of light from the output of the variable mirror to the switch is not affected by said varying of the variable mirror.

10. The apparatus of claim 5, further comprising at least one optical amplifier configured to amplify the beam of light as it travels through the free space time delay.

11. The apparatus of claim 5, wherein the light beam is linearly polarized, and the activation signal controller further includes at least one beam splitter configured to transmit light that is linearly polarized parallel to a transmission axis and reflect light that is linearly polarized perpendicular to the transmission axis.

12. The apparatus of claim 11, further comprising at least one wave plate configured to rotate the polarization axis of the light beam by 90 degrees.

13. A method for generating frequency-variable multi cycle digital high power microwaves (MCD-HPM), the method comprising:
   providing a microwave transmission line (MTL) and a plurality of thin film transmission lines (TFTL's), each TFTL being configured to store an electric charge, each TFTL being connected to the MTL by a corresponding switch, the switch being configured to discharge the corresponding TFTL and thereby introduce an energy pulse into the MTL when the switch is activated;
   transmitting a triggering signal through a free space time delay, said free space time delay being configured to generate a plurality of activation signals from a plurality of outputs in response to passage of the triggering signal through the free space time delay;

applying the activation signals sequentially to the switches according to a sequence and timing that generates an energy pulse train in the MTL, each activation signal being applied to activate a single corresponding switch, the energy pulse train approximating a square wave at an output microwave frequency; and modifying at least one of the sequence and timing by controlling at least one of a position and an orientation of at least one of a plurality of independently variable elements included in the free space time delay, thereby modifying the activation timing, and thereby adjusting the output microwave frequency.

14. The method of claim 13, wherein the energy pulses are of alternating polarity.

15. The method of claim 13, wherein at least one of the variable elements is independently variable in orientation, and modifying the free space time delay includes reorienting at least one of the variable elements.

16. The method of claim 13, wherein modifying the free space time delay includes repositioning at least one of the variable elements.

17. The method of claim 13, wherein the switches are photoconductive switches, and the activation signal is a beam of light.

18. The method of claim 17, wherein the beam of light is a laser beam.

19. The method of claim 17, wherein for each of the switches the activation signal controller includes a partially reflecting mirror configured to deliver to the switch a transmitted portion of light incident on the partially reflecting mirror.

20. The method of claim 17, further comprising amplifying the beam of light as it is transmitted through the free space time delay.

* * * * *